United States Patent
Igarashi et al.

(10) Patent No.: US 8,159,575 B2
(45) Date of Patent: Apr. 17, 2012

(54) SOLID-STATE IMAGE PICKUP APPARATUS AND METHOD FOR MANUFACTURING THE SAME

(75) Inventors: Takatoshi Igarashi, Nagano (JP); Kazuya Matsumoto, Nagano (JP)

(73) Assignee: Olympus Corporation, Tokyo (JP)

( * ) Notice: Subject to any disclaimer, the term of this patent is extended or adjusted under 35 U.S.C. 154(b) by 512 days.

(21) Appl. No.: 12/401,846

(22) Filed: Mar. 11, 2009

(65) Prior Publication Data

US 2009/0231477 A1 Sep. 17, 2009

(30) Foreign Application Priority Data

Mar. 13, 2008 (JP) .................................. 2008-064651

(51) Int. Cl.
*H04N 3/14* (2006.01)
*H01L 31/062* (2006.01)

(52) U.S. Cl. ....................................... 348/294; 257/292

(58) Field of Classification Search .................. 348/294, 348/297, 296, 222.1, 308; 257/290–295
See application file for complete search history.

(56) References Cited

U.S. PATENT DOCUMENTS 5,428,231 A * 6/1995 Tanaka et al. .................. 257/232
5,710,447 A * 1/1998 Tohyama ....................... 257/230

FOREIGN PATENT DOCUMENTS

| JP | 7-202152 | 8/1995 |
| JP | 2001-257334 | 9/2001 |
| JP | 3880278 | 11/2006 |

* cited by examiner

*Primary Examiner* — Mohammed Hasan
(74) *Attorney, Agent, or Firm* — Scully, Scott, Murphy & Presser, P.C.

(57) ABSTRACT

A solid-state image pickup apparatus includes: a first major surface on which a light receiving portion is formed; a second major surface opposed to the first major surface, and a hermetic seal portion formed on the first major surface, for sealing the light receiving portion, the hermetic seal portion being formed by a flat plate portion made of a transparent inorganic insulating member and a frame portion made of an inorganic insulating film.

8 Claims, 5 Drawing Sheets

SOLID-STATE IMAGE PICKUP APPARATUS AND METHOD FOR MANUFACTURING THE SAME

CROSS REFERENCE TO RELATED APPLICATION

This application claims the benefit of Japanese Application No. 2008-064651 filed in Japan on Mar. 13, 2008, the contents of which are incorporated by this reference.

BACKGROUND OF THE INVENTION

1. Field of the Invention

The present invention relates to a solid-state image pickup apparatus in which a light receiving portion is hermetically sealed, and a method for manufacturing the same.

2. Description of the Related Art

Figure 1:
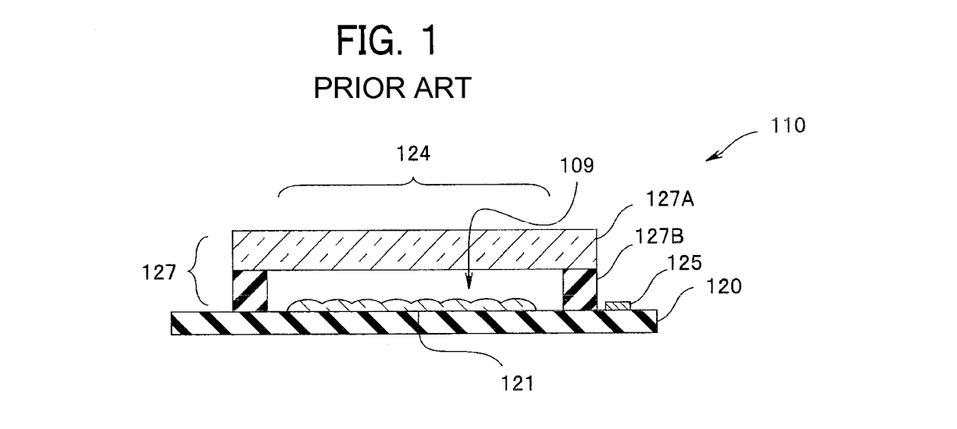
FIG. 1 is a cross-sectional explanatory view showing a schematic structure of a publicly known solid-state image pickup apparatus.
Figure 2:
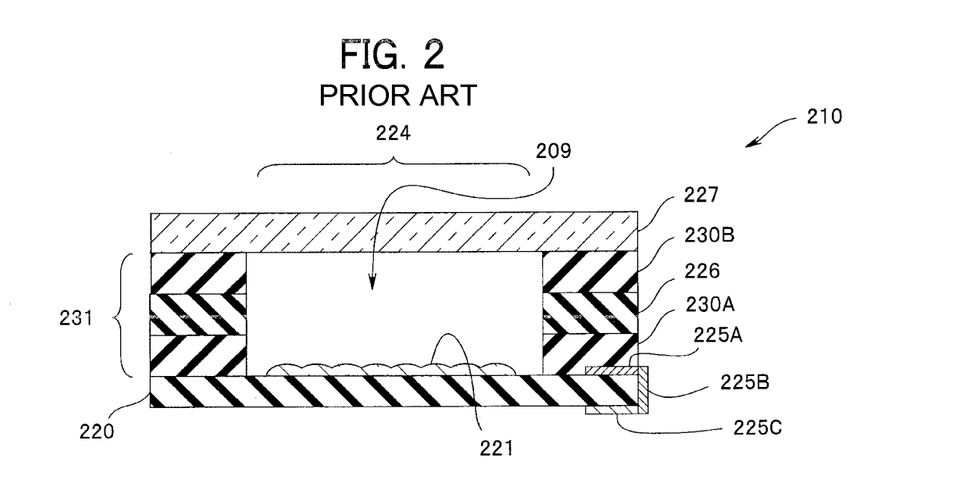
FIG. 2 is a cross-sectional explanatory view showing a schematic structure of a publicly known solid-state image pickup apparatus.

The applicant has proposed a solid-state image pickup apparatus, in which a light receiving portion is hermetically sealed, having a novel structure particularly having a small shape after mounting to allow application to a field requiring small size mounting. FIG. 1 and FIG. 2 are cross-sectional explanatory view showing schematic structures of publicly known solid-state image pickup apparatuses already proposed by the applicant.

For example, the applicant has proposed a solid-state image pickup apparatus 110, in which a hermetic seal portion 109 is provided only in a light receiving area 124 of a solid-state image pickup device chip 120, shown in FIG. 1 in Japanese Patent Application Laid-Open Publication No. 7-202152. In the solid-state image pickup apparatus 110, a seal member 127 forming the hermetic seal portion 109 is composed of two members of a flat plate portion 127A made of a transparent member, and a frame portion 127B. It is described that the frame portion 127B of the seal member 127 may be formed using an inorganic substance, such as ceramic, glass, or silicon, or a metal, such as Kovar or alloy 42, but that a resin, such as an epoxy, phenol, or silicon resin, may be pattern formed on a surface of the solid-state image pickup device chip 120 by printing or a photolithography technique, and that the seal member 127, in which the frame portion 127B is adhered to the flat plate portion 127A, may be adhered to the surface of the solid-state image pickup device chip 120.

Also, the applicant has proposed a solid-state image pickup apparatus 210 shown in FIG. 2 in Japanese Patent No. 3880278. The solid-state image pickup apparatus 210 has a structure in which a solid-state image pickup device chip 220 having a light receiving portion 224 in which a microlens 221 is formed, an adhesive layer 230A, an epoxy-based resin sheet 226 having a perforated portion only in the light receiving portion 224, an adhesive layer 230B, and a flat plate portion 227 made of a transparent member are laminated and adhered. In other words, in the solid-state image pickup apparatus 210, a hermetic seal portion 209 is formed by a frame portion 231 including the resin sheet 226, the adhesive layer 230A, and the adhesive layer 230B, and the flat plate portion 227. Here, it is described that as a material of the flat plate portion 227, glass, quartz, sapphire, a transparent resin, or the like is suitable, and that as the adhesive layer 230A or 230B, an epoxy-based or silicon-based resin adhesive is suitable.

For leading out an electrode line from a pad electrode portion, not shown, formed on a periphery of a surface of the solid-state image pickup device chip 220, the solid-state image pickup apparatus 210 has a pad portion wiring 225A electrically connected to the pad electrode portion, a chip side wiring 225B, and a chip back wiring 225C, and the chip back wiring 225C is further electrically connected to a back pad electrode portion not shown. The solid-state image pickup apparatus 210 can be electrically connected to a mounting substrate or the like from the back pad electrode portion via a bump or the like.

In the solid-state image pickup apparatus 110 and the solid-state image pickup apparatus 210, small size mounting is possible, and particularly, even if an optical component, such as a filter, a microlens, or a prism, is formed on a surface of the solid-state image pickup device chip, an optical capability of the optical component does not decrease.

However, in the solid-state image pickup apparatus 210, the frame portion 231 forming the hermetic seal portion 209 has the resin sheet 226 and the resin adhesive layers 230A and 230B as components. It is not easy to precisely control a thickness of the resin adhesive layer or the like, so that a height of the frame portion 231, that is, a distance between the flat plate portion 227 and the surface of the solid-state image pickup device chip 220, may fluctuate. The distance between the flat plate portion 227 and the surface of the solid-state image pickup device chip 220 may cause an optical interference effect, depending on the distance. Therefore, if the distance between the flat plate portion 227 and the surface of the solid-state image pickup device chip 220 fluctuates between lots, fluctuations in optical properties of the microlens or the like, that is, fluctuations in image pickup properties of the solid-state image pickup apparatus 210, may occur between lots.

Also, in the solid-state image pickup apparatus 210 using a resin as a component of a seal member forming the hermetic seal portion 209, moisture resistance and durability properties, that is, reliability, may not be sufficient. Also, the chip side wiring 225B for leading out the electrode line of the solid-state image pickup apparatus 210 is formed after solid-state image pickup device chips are separated into individual pieces from a wafer, so that a manufacturing process is complicated.

Similarly, in the solid-state image pickup apparatus 110, the frame portion 127B formed separately is adhered to the flat plate portion 127A, which is adhered to the surface of the solid-state image pickup device chip 120. Therefore, in the solid-state image pickup apparatus 110, it is not easy to always control a height of the frame portion 127B, that is, a distance between the flat plate portion 127A and the surface of the solid-state image pickup device chip 120, at a constant level. Therefore, for the solid-state image pickup apparatus 110, fluctuations in optical properties of the microlens or the like, that is, fluctuations in image pickup properties between lots, may occur.

Also, the frame portion forming the hermetic seal portion in the solid-state image pickup apparatus 110 and the solid-state image pickup apparatus 210 is a member only for forming the hermetic seal portion.

As described above, in conventional solid-state image pickup apparatuses, importance of forming the hermetic seal portion, addressing small size mounting, and the like is recognized, but it cannot be said that sufficient attention is paid to a material of the seal member for forming the hermetic seal portion, a method for forming the hermetic seal portion, and protection of a region other than the light receiving area.

SUMMARY OF THE INVENTION

A solid-state image pickup apparatus according to the present invention includes: a first major surface on which a light receiving portion is formed; a second major surface opposed to the first major surface, and a hermetic seal portion formed on the first major surface, for sealing the light receiving portion, the hermetic seal portion being formed by a flat plate portion made of a transparent inorganic insulating member and a frame portion made of an inorganic insulating film.

A method for manufacturing a solid-state image pickup apparatus according to the present invention includes an inorganic insulating film forming step of forming, on a first major surface of a wafer having the first major surface on which light receiving portions of a plurality of solid-state image pickup devices are formed, and a second major surface opposed to the first major surface, an inorganic insulating film having a perforated portion in a region including at least the light receiving portion; a bonding step of directly bonding a flat plate made of a transparent inorganic insulating member to the inorganic insulating film to form a hermetic seal portion sealing the light receiving portion; and a dividing step of dividing the wafer into a plurality of solid-state image pickup apparatuses.

BRIEF DESCRIPTION OF THE DRAWINGS

FIG. 6A to FIG. 6G are cross-sectional explanatory views showing schematic structures for explaining a process for manufacturing a solid-state image pickup apparatus according to the embodiment of the present invention; and FIG. 7A to FIG. 7E are cross-sectional explanatory views showing schematic structures for explaining a process for manufacturing a solid-state image pickup apparatus according to the embodiment of the present invention.

DETAILED DESCRIPTION OF THE PREFERRED EMBODIMENTS

Embodiments

Figure 3:
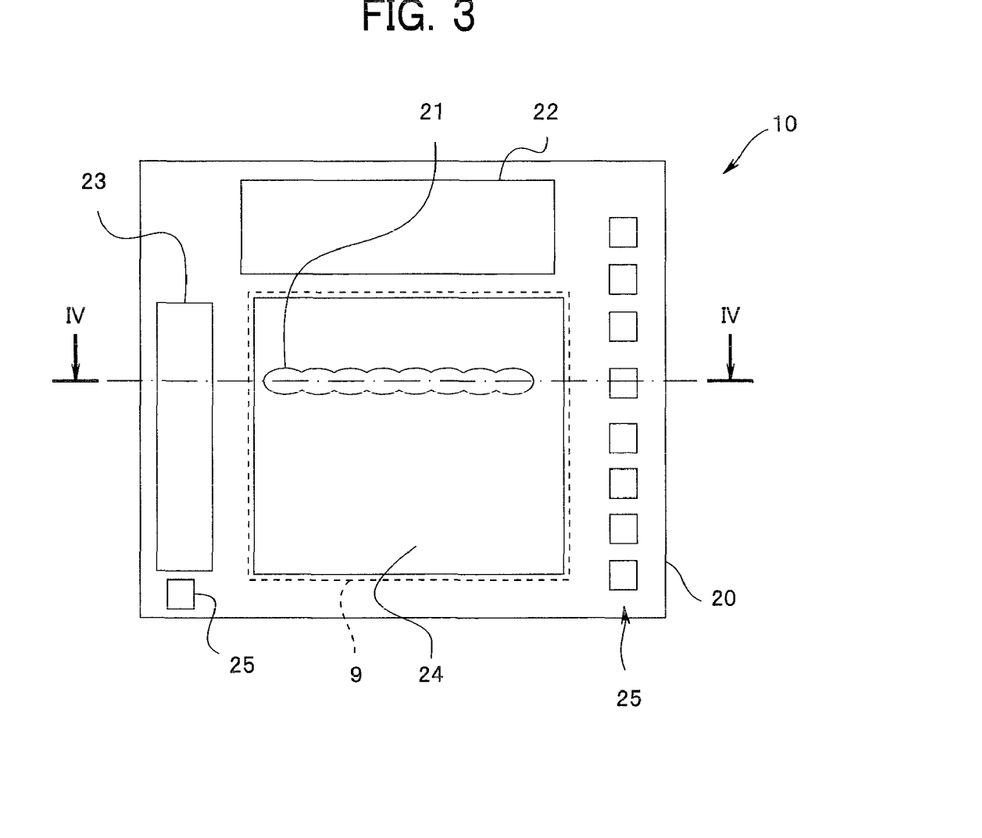
FIG. 3 is a plan view of a solid-state image pickup apparatus according to an embodiment of the present invention.
Figure 4:
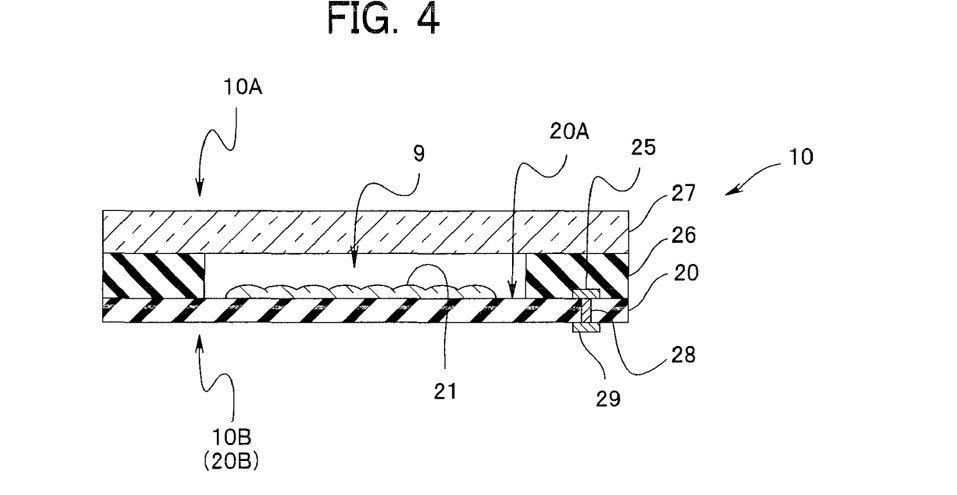
FIG. 4 is a cross-sectional explanatory view showing a schematic structure of the solid-state image pickup apparatus according to the embodiment of the present invention.

First, a structure of a solid-state image pickup apparatus 10 according to an embodiment of the present invention is described with reference to drawings. FIG. 3 is a plan view of the solid-state image pickup apparatus 10 according to the present embodiment observed from a first major surface 10A side, and FIG. 4 is a cross-sectional explanatory view showing a schematic structure of the solid-state image pickup apparatus 10 along line IV-IV in FIG. 3. In FIG. 3, only a part of a microlens 21 is shown.

As shown in FIG. 3, a solid-state image pickup device chip 20 has a solid-state image pickup device, such as a CCD (Charge Coupled Device) type or a MOS (Metal Oxide Semiconductor) type, and has a light receiving portion 24, in which the microlens 21 and a color filter not shown are disposed, on a first major surface 20A of the solid-state image pickup device chip 20.

In the solid-state image pickup device chip 20, a hermetic seal portion 9, which is an externally enclosed space, is formed in a light receiving portion 24 region, which is a region including at least the light receiving portion 24 on the first major surface 20A, to protect the light receiving portion 24 from moisture and the like from external environment. In other words, the light receiving portion 24 is sealed by the hermetic seal portion 9.

The hermetic seal portion 9 is an enclosed space formed by a frame portion made of a silicon oxide film, which is an inorganic insulating film 26 formed by a plasma CVD (Plasma Chemical Vapor Deposition: P-CVD) method, and a flat plate portion 27 made of a transparent inorganic insulating member, such as glass or quartz. Here, a member means a bulk member that can be handled alone, and a film means being integral with and inseparable from a film-made substrate. Also, transparent means that substantial light absorption is small in terms of spectral sensitivity properties of the solid-state image pickup device, and does not necessarily means transparent in terms of human vision.

A material of the inorganic insulating film 26 is not limited to silicon dioxide, and any of silicon oxide, silicon nitride, silicon oxynitride, yttria, alumina, sialon, amorphous silicon, or amorphous silicon carbide can be preferably used.

Also, a method for making the inorganic insulating film 26 is not limited to the P-CVD method, and any of a CVD method, a sputtering method, or a vacuum deposition method can be preferably used.

As shown in FIG. 3, not only the light receiving portion 24, but also peripheral circuits 22 and 23 for an image pickup operation of the light receiving portion 24, a plurality of pad electrodes 25, and the like are formed on the first major surface 20A of the solid-state image pickup device chip 20. Also, as shown in FIG. 4, the solid-state image pickup apparatus 10 has through wirings 28 formed from under the pad electrodes 25 on the first major surface 20A of the solid-state image pickup device chip 20 to a second major surface 20B, and external terminals 29 on the second major surface 20B and the pad electrodes 25 are electrically connected via the through wirings 28.

As shown in FIG. 3, in the solid-state image pickup device chip 20, a region in which the hermetic seal portion 9 is formed is the light receiving portion 24 region. Therefore, in the solid-state image pickup device chip 20, the frame portion forming the hermetic seal portion 9 also has action as a protective film for the peripheral circuit 22, the peripheral circuit 23, and the pad electrodes 25. In other words, the frame portion forming the hermetic seal portion 9 is the inorganic insulating film 26, so that the inorganic insulating film 26 acts as a protective film in a region on the first major surface 20A other than the region in which the hermetic seal portion 9 is formed. In other words, the inorganic insulating film 26 covers the pad electrodes 25 on the first major surface 20A. Therefore, the solid-state image pickup apparatus 10 has high reliability. To exhibit the function, the region in which the hermetic seal portion 9 is formed is preferably only the light receiving portion 24 region. The light receiving portion 24 region means the light receiving portion 24 and a region around the light receiving portion 24, and is, for example, a region having an area of 101 to 200% of an area of the light receiving portion 24. The inorganic insulating film 26 need not be formed in a region that should be exposed on the first major surface 20A.

Figure 5:
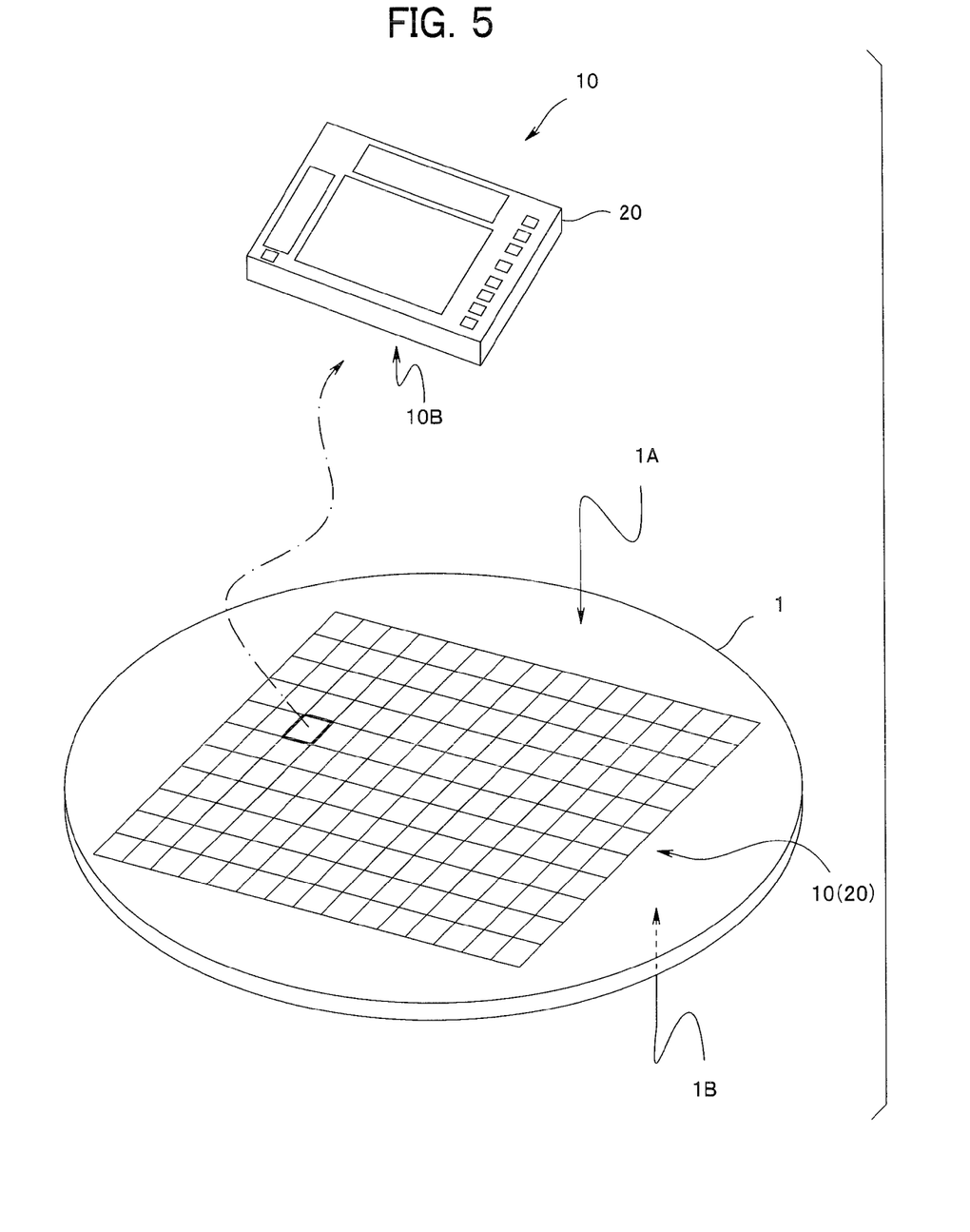
FIG. 5 is an explanatory view for explaining a method for manufacturing a solid-state image pickup apparatus according to an embodiment of the present invention.

Here, a method for manufacturing the solid-state image pickup apparatus 10 in the present embodiment is briefly described using FIG. 5. FIG. 5 is an explanatory view for explaining the method for manufacturing the solid-state image pickup apparatus 10, and the flat plate portion 27 and the inorganic insulating film 26 are not shown. As shown in FIG. 5, in manufacture of the solid-state image pickup apparatus 10, first, a plurality of the solid-state image pickup device chips 20 are formed on a first major surface 1A of a wafer 1 made of silicon by a publicly known semiconductor process. Subsequently, by steps described below, the hermetic seal portions 9, the through wirings 28, and the like are collectively formed in the plurality of solid-state image pickup device chips 20 in a wafer state, and then, the wafer 1 is diced and separated into individual solid-state image pickup apparatuses 10, that is, separated into individual pieces. Therefore, the method for manufacturing the solid-state image pickup apparatus 10 in the present embodiment has good production efficiency.

As described above, in this specification, the solid-state image pickup device chip 20 means one region of the wafer constituting the individual solid-state image pickup apparatus after an dividing step, that is, after separation into individual pieces. Also, the first major surface 1A of the wafer 1 is a surface on a same side as the first major surface 10A of the solid-state image pickup apparatus 10 and the first major surface 20A of the solid-state image pickup device chip 20, and the second major surface 1B of the wafer 1 is a surface on a same side as the second major surface 10B of the solid-state image pickup apparatus 10 and the second major surface 20B of the solid-state image pickup device chip 20.

In the solid-state image pickup apparatus 10, the hermetic seal portion 9 is formed by the frame portion made of the inorganic insulating film 26, and the flat plate portion made of an inorganic insulating member, so that a film thickness of the inorganic insulating film 26 corresponds to a height of the frame portion. Control of the film thickness of the inorganic insulating film 26 is easy, so that in the solid-state image pickup apparatus 10, the height of the frame portion is stable. Therefore, for the solid-state image pickup apparatus 10, fluctuations in image pickup properties between lots are small.

Also, in the solid-state image pickup apparatus 10, the hermetic seal portion 9 is formed by the frame portion made of the inorganic insulating film 26, and the flat plate portion made of an inorganic insulating member, that is, a periphery of the hermetic seal portion 9 is composed of only an inorganic insulator having no organic substance such as an adhesive layer, so that moisture resistance and durability properties, that is, reliability, can be sufficiently ensured.

Further, the solid-state image pickup apparatus 10 has the through wirings 28 formed from under the pad electrodes 25 on the first major surface 20A of the solid-state image pickup device chip 20 to the second major surface 20B, and the external terminals 29 on the second major surface 20B and the pad electrodes 25 are electrically connected via the through wirings 28. In a stage of the wafer with the plurality of solid-state image pickup device chips 20 formed, conduction portions from the image pickup devices of the plurality of solid-state image pickup device chips 20 to the external terminals 29 can be collectively formed. Therefore, for the solid-state image pickup apparatus 10, a manufacturing process is simple.

Further, in the solid-state image pickup apparatus 10, the frame portion forming the hermetic seal portion 9 is not only for forming the hermetic seal portion 9, but also has a function as the protective film for the circuits and the like formed on the first major surface 20A of the solid-state image pickup device chip 20. Therefore, the solid-state image pickup apparatus 10 has high moisture resistance and durability properties, that is, reliability.

Next, a process for manufacturing the solid-state image pickup apparatus 10 according to an embodiment of the present invention is described with reference to the drawings. FIG. 6A to FIG. 6G are cross-sectional explanatory views showing schematic structures for explaining the process for manufacturing the solid-state image pickup apparatus 10 according to the present embodiment, and the cross-sectional explanatory view shown in FIG. 6G is a same view as the cross-sectional explanatory view shown in FIG. 4.

The method for manufacturing the solid-state image pickup apparatus 10 will be described below according to FIG. 6A to FIG. 6G.

<Wafer Preparation Step>

Figure 6A:
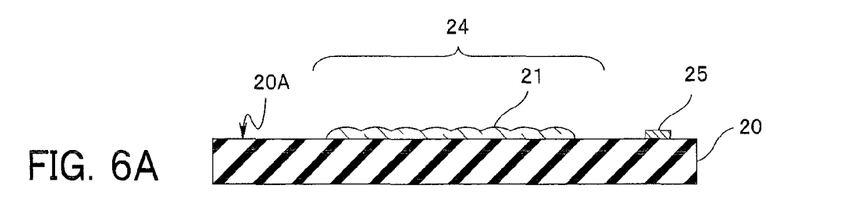

As shown in FIG. 6A, the wafer 1 made of silicon, in which the plurality of solid-state image pickup device chips 20 are formed, is prepared. FIG. 6A to FIG. 6G are cross-sectional explanatory views showing schematic structures of one solid-state image pickup device chip 20 in the wafer 1.

As already described, each of the individual solid-state image pickup device chips 20 has the light receiving portion 24, in which the microlens 21 and the color filter not shown are disposed, on the first major surface 20A of the solid-state image pickup device chip 20. Further, the plurality of pad electrodes 25 are formed around the light receiving portion 24 on the first major surface 20A for electrical connection of the solid-state image pickup apparatus. Due to the microlens 21, the color filter, and the pad electrodes 25, the first major surface 20A of the solid-state image pickup device chip 20 has an uneven shape.

<Inorganic Insulating Film Forming Step>
<Inorganic Insulating Film Making Step>

Figure 6B:
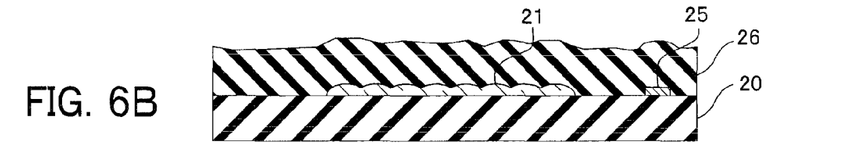

As shown in FIG. 6B, a $SiO_2$ film, which is the inorganic insulating film 26, is made on the first major surface 20A of the solid-state image pickup device chip 20 by a P-CVD method. Film making temperature is preferably 150° C. or less to prevent degradation of the microlens 21 and the like. A film thickness of the inorganic insulating film 26 is several μm to several hundred μm, for example, 5 μm to 100 μm, preferably 10 μm to 60 μm. Below the range, control and precision of a height of the frame portion is strictly demanded, so that manufacture is not easy. Above the range, not only film making is time consuming, but also film stress increases.

Here, a material of the inorganic insulating film 26 can be selected from inorganic insulating materials that can be made as a thin film, and silicon oxide: $SiO_x$ (x=1 to 2), silicon nitride: $SiN_x$ (x=1 to 1.4), silicon oxynitride: $SiO_xN_y$, alumina: $Al_2O_3$, Sialon: SiAlON, or yttria: $Y_2O_3$ can be preferably used. Further, as the material of the inorganic insulating film 26, amorphous silicon (a-Si) or amorphous silicon carbide (a-SiC) having high resistivity can also be preferably used. Amorphous silicon and amorphous silicon carbide also have a function as a light-shielding film because amorphous silicon and amorphous silicon carbide absorb visible light, but amorphous silicon and amorphous silicon carbide have somewhat worse insulation properties compared with silicon oxide and the like. Therefore, when amorphous silicon or amorphous silicon carbide is used as the inorganic insulating film 26, the inorganic insulating film 26 having a two-layer structure is preferred. To make the inorganic insulating film 26 having a two-layer structure, first, a silicon oxide film having higher insulation properties, or the like is made on the first major surface 20A. Next, a film of amorphous silicon or amorphous silicon carbide is made on the silicon oxide film or the like. Of course, a step is simpler when the inorganic insulating film 26 having a single layer is used, using a single inorganic insulating material as the material of the inorganic insulating film 26, but the inorganic insulating film 26 having a two-layer structure may be selected from the viewpoint of film making speed and the like.

As a method for making the inorganic insulating film 26, a sol-gel method or the like can also be used, but a CVD method, a sputtering method, or a vacuum deposition method, which is a low-temperature film making method, is preferably used.

In other words, in an inorganic insulating film making step, preferably, an inorganic insulating film made of any of silicon oxide, silicon nitride, silicon oxynitride, yttria, alumina, Sialon, amorphous silicon, or amorphous silicon carbide is made by a CVD method, a sputtering method, or a vacuum deposition method.

<Planarization Step>

As shown in FIG. 6B, also after the inorganic insulating film 26 is made, the first major surface 20A has an uneven shape due to an effect of the microlens 21, the pad electrodes 25, and the like. Therefore, preferably, planarization processing is performed on the first major surface 20A by a chemical mechanical polishing method (hereinafter referred to as a CMP method).

The CMP method is a polishing method in which a wafer is held by a member called a carrier, and is pressed against a lap on which a polishing cloth or a polishing pad is attached, and while a slurry including various chemical components and fine hard abrasive particles is flowed, the carrier and the lap are relatively moved to perform polishing. In the CMP method, by the chemical components changing a surface of an object to be polished, not only processing speed can be improved, compared with a case where polishing is performed with an abrasive alone, but also fine scratches in the surface remaining when polishing is performed with an abrasive alone, and a processing-altered layer remaining near the surface are very thin, so that a smooth surface can be obtained.

Figure 6C:
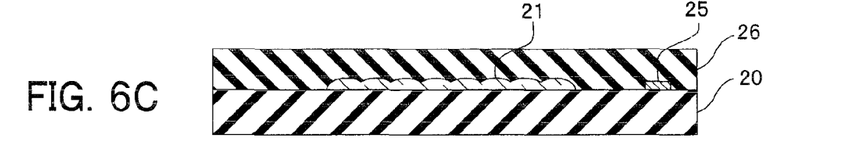

As shown in FIG. 6C, by performing planarization processing by the CMP method, the surface of the inorganic insulating film 26 is planarized, and surface roughness can also be at a nm level.

In other words, in a planarization step, the inorganic insulating film 26 is preferably planarized by the CMP method.

<Perforated Portion Forming Step>

Figure 6D:
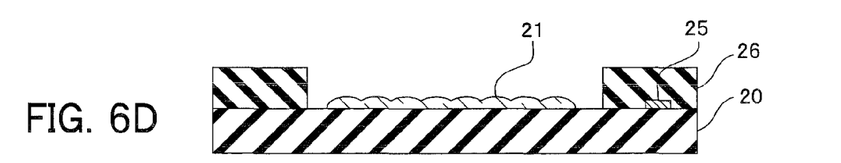
Figure 6E:
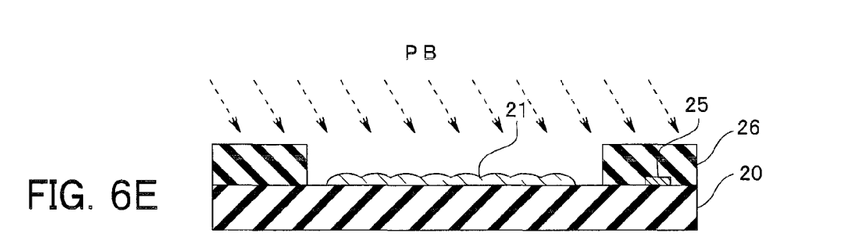

Next, as shown in FIG. 6D, a perforated portion, which is the hermetic seal portion 9, is formed in the inorganic insulating film 26 in the region including at least the light receiving portion 24. In other words, in the inorganic insulating film 26 made on the first major surface 20A, the inorganic insulating film 26 in the light receiving portion 24 region is removed. In a perforated portion forming step, the perforated portion is formed in the inorganic insulating film 26 in the region including at least the light receiving portion 24.

In a perforated portion forming method performed by etching the inorganic insulating film 26, first, an entire surface of the inorganic insulating film 26 is coated with a photoresist, which is exposed through a photomask and developed to protect a region other than the perforated portion with a resist film. Then, the inorganic insulating film 26 in the perforated portion is selectively removed by wet etching using a solution of hydrofluoric acid or the like, or dry etching using a carbon tetrafluoride gas or the like. The microlens 21, the color filter, or the like is composed of an organic substance, so that a speed of etching with hydrofluoric acid or the like for the microlens 21, the color filter, or the like is much slower than that for the inorganic insulating film 26, and the microlens 21, the color filter, or the like is not adversely affected by etching. After etching, the resist film is removed.

When a surface of the microlens 21, the color filter, or the like can be adversely affected in removing the resist film, a double mask photolithography method is preferably used. In the double mask photolithography method, a metal film is made on the inorganic insulating film 26, a resist film is pattern formed on the metal film, and the metal film is patterned. Then, using the patterned metal film as an etching mask, etching processing of the inorganic insulating film 26 is performed to form the perforated portion in the inorganic insulating film 26, and then, the metal film is removed.

The inorganic insulating film forming step of forming the inorganic insulating film 26 having the perforated portion may be not only the step described above but also a step using a damascene processing method described below. FIG. 7A to FIG. 7E are cross-sectional explanatory views showing schematic structures for explaining a step of forming the inorganic insulating film 26 having the perforated portion of the solid-state image pickup apparatus 10.

Figure 7A:
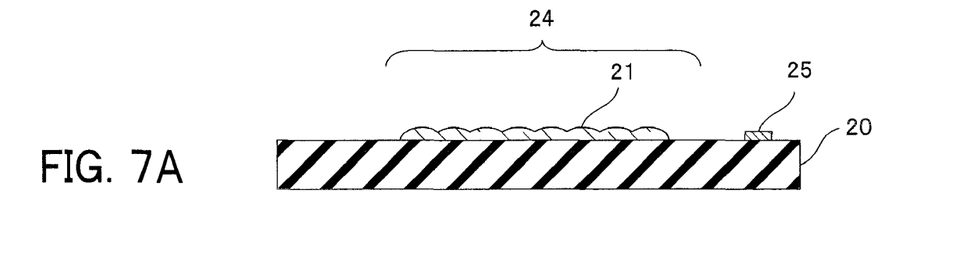

As shown in FIG. 7A, the wafer 1 made of silicon, in which the plurality of solid-state image pickup device chips 20 are formed, and in which the microlens 21 and the pad electrodes 25 are formed in the light receiving portion 24 on the first major surface 1A, is prepared. FIG. 7A to FIG. 7E are cross-sectional explanatory views showing schematic structures of one solid-state image pickup device chip 20 in the wafer 1.

Figure 7B:
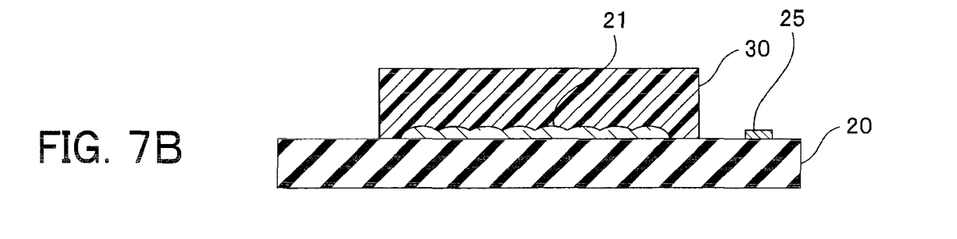
Figure 7C:
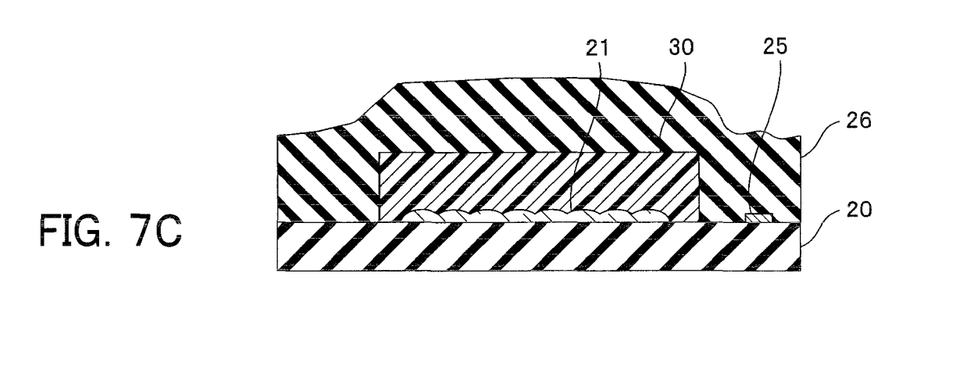
Figure 7D:
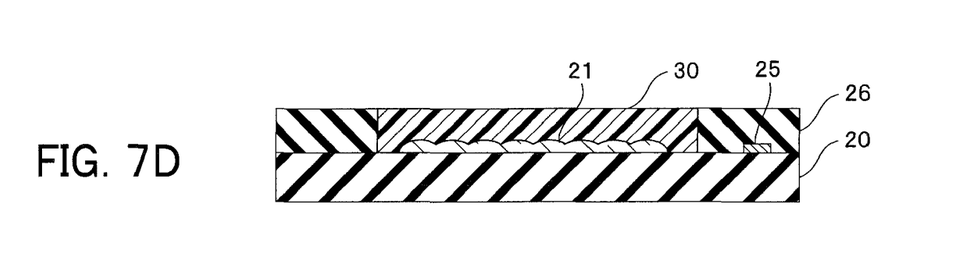
Figure 7E:
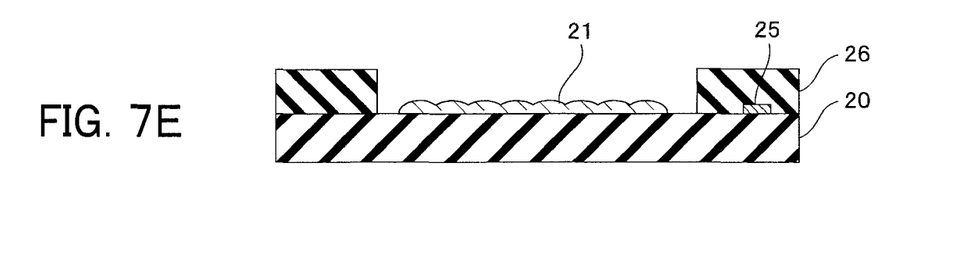

Then, as shown in FIG. 7B, in the damascene processing method, a resist pattern forming step of forming a resist film pattern 30 in the light receiving portion 24 region forming the hermetic seal portion 9 is performed before the inorganic insulating film 26 is made. Then, as shown in FIG. 7C, in an inorganic insulating film making step, the inorganic insulating film 26 is made by a CVD method, a sputtering method, or a vacuum deposition method. Subsequently, as shown in FIG. 7D, a planarization step of polishing the inorganic insulating film 26 by the CMP method until the resist film is exposed is performed. Then, as shown in FIG. 7E, the resist film is removed.

In other words, in the damascene processing method, the inorganic insulating film forming step includes a resist pattern forming step of forming a resist film pattern in the region including at least the light receiving portion 24, an inorganic insulating film making step of making the inorganic insulating film by a CVD method, a sputtering method, or a vacuum deposition method, and a planarization step of planarizing the inorganic insulating film 26 by the CMP method.

By using the damascene processing method described above, the inorganic insulating film 26 having the perforated portion can be formed without damaging the microlens 21 or the like even if the microlens 21 or the like is composed of the same inorganic insulator as the inorganic insulating film 26, such as $SiO_2$.

Also, a lift-off method may be used for formation of the perforated portion. In the lift-off method, a resist film pattern is formed in the light receiving portion 24 region forming the hermetic seal portion 9 before the inorganic insulating film 26 is made, subsequently, the inorganic insulating film 26 is made on an entire surface of the wafer, and then, the resist, together with only the inorganic insulating film formed on a surface of the resist, is collectively removed. Also in this case, the perforated portion can be formed without damaging the microlens 21 or the like even if the microlens 21 or the like is composed of an inorganic insulator, as in the damascene processing method.

<Bonding Step>

Figure 6F:
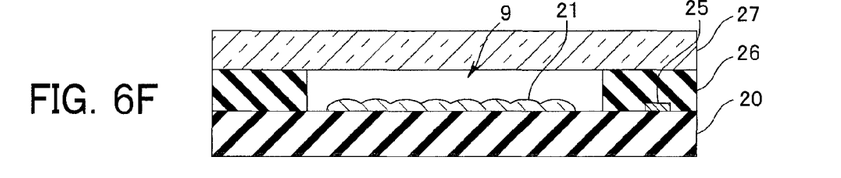
Figure 6G:
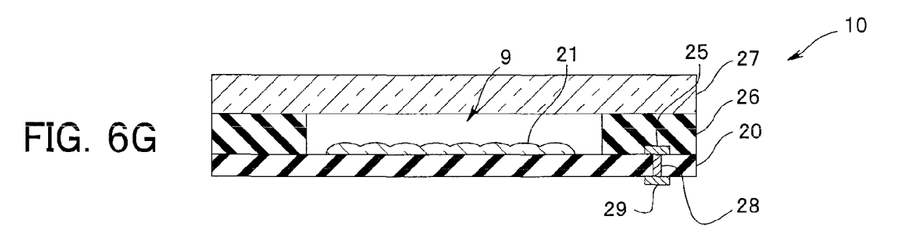

Next, as shown in FIG. 6F, a flat plate, which is the flat plate portion 27, made of a transparent inorganic insulating member is directly bonded to the inorganic insulating film 26 to form the hermetic seal portion 9. Here, direct bonding is a low-cost and excellent bonding method in which strong bonding is obtained only by performing pressure bonding processing in air or a vacuum, with surface precision of surfaces improved, and with the surfaces cleaned, without interposing another material, such as an adhesive material, and without necessity of applying an electric field to materials as in anode bonding. In this specification, "bonding" means that the flat plate portion 27 and the inorganic insulating film 26 are integrated without interposing a different type of layer, such as an adhesive, at an interface, and is a technique different from "adhesion," that is, sticking together via a different type of layer, such as an adhesive.

Also, the flat plate portion 27 is a part of the flat plate made of a transparent inorganic insulating member, such as glass or quartz, having a size corresponding to the wafer 1 and is bonded, in a wafer state shown in FIG. 5, to the inorganic insulating film 26 on the first major surface 1A. In other words, the flat plate portion 27 is bonded as the flat plate to the wafer. The bonding step preferably includes a flat plate planarizing step, which is planarization processing by CMP, as in the inorganic insulating film 26, also for a surface of the flat plate portion 27, that is, the flat plate, to be bonded to the inorganic insulating film 26, before bonding processing. By the flat plate planarizing step, a surface roughness of the surface of the flat plate to be bonded to the inorganic insulating film 26 is at a nm level.

A processing temperature of bonding processing is preferably 150° C. or less. By using low-temperature bonding processing, not only prevention of degradation of the microlens 21 and the like is intended, but also reliability and durability of bonded portions are further improved due to small thermal strain and thermal stress. An atmosphere of bonding processing is preferably an inert gas, such as nitrogen, argon, or neon, or air. A pressure of the atmosphere of bonding processing is selected from reduced pressure, for example, a low vacuum to an ultrahigh vacuum at a level of $10^{-6}$ to $10^{-7}$ Pa, or atmospheric pressure.

Here, the bonding step preferably includes an activation step of performing surface activation processing on at least one of surfaces of the flat plate 27 and the inorganic insulating film 26 to be bonded, and particularly preferably performing surface activation processing on both of the surfaces to be bonded. Further, surface activation processing is particularly preferably performed by particle beam irradiation processing or light irradiation processing. FIG. 6E shows a state in which surface activation processing is performed on a surface of the inorganic insulating film 26 to be bonded, by particle beam irradiation processing.

The surface activation step is a step of cleaning a surface to be bonded to make the surface to be bonded a clean surface at an atomic level. According to bonding processing including the activation step of performing surface activation processing, by removing a surface layer of a surface to be bonded, which prevents bonding, and performing bonding, bonds of atoms in surfaces are directly bonded to each other, so that strong bonding can be formed even at low temperature.

A FAB (Fast Atomic Beam) using a neutral atom, an ion beam of argon or the like, or plasma can be used for particle beam irradiation processing. Also, ultraviolet rays or the like can be used for light irradiation processing.

For example, first, the wafer 1 on which the inorganic insulating film 26 is formed, and the flat plate made of a transparent inorganic insulating member were washed, dried, and then set in a bonding chamber, which is evacuated by a vacuum pump into a vacuum state. Then, after the bonding chamber is evacuated to about $2\times10^{-6}$ Pa, the flat plate and the inorganic insulating film 26 are each subjected to surface activation processing with an argon beam at room temperature. Here, as the above beam, an argon beam at an incidence angle of about 25° to a surface of a substrate and at an energy of 1.4 keV is irradiated for 60 seconds.

A surface subjected to particle beam irradiation processing in this manner is in an activated state in which atoms having bonds are exposed, and bonding force to other atoms increases. When the flat plate and the inorganic insulating film 26 are pressure bonded in a state in which surfaces are activated in this manner, molecules are covalently bonded in surfaces to be bonded, so that the flat plate and the inorganic insulating film 26 can be reliably bonded.

Particularly, in the present embodiment, planarization processing by the CMP method is performed, and processing is performed to a surface roughness at a nm level, so that the flat plate (the flat plate portion 27) and the inorganic insulating film 26 can be easily directly bonded.

In bonding, by using a bonding apparatus with high alignment precision, the flat plate portion 27, on which an optical lens, such as a Fresnel lens, or the like is already formed, can be placed at a desired position in the light receiving portion 24 with high precision.

<Through Hole Forming Step>

Next, as shown in FIG. 6G, the through wirings 28 and the external terminals 29 are formed in the solid-state image pickup device chip 20 in a wafer state. In a through hole forming step, first, the wafer 1 made of silicon is subjected to polishing processing, on a second major surface 1B side, to a desired thickness. Then, a plurality of through holes are formed from the second major surface 1B side to back surfaces of the pad electrodes 25 on the first major surface 1A. In other words, a plurality of through holes are formed from the second major surface 1B to the first major surface 1A of the wafer 1.

A DRIE (Deep Reactive Ion Etching) method using a resist mask, a laser ablation processing method, mechanical drilling, a water jet method, or the like can be used for formation of the through holes.

Then, an electrically insulating film of $SiO_2$ or the like is made on inner surfaces of the through holes.

<Conductivity Step>

An inside of the through holes is subjected to conductivity processing by a publicly known method, such as a plating method or conductive paste filling, so that the through wirings 28 are formed.

Then, the external terminals 29 are formed on the through wirings 28 in the second major surface 1B.

<Dividing Step>

After various steps at a wafer level described above are finished, the wafer 1 is separated into individual pieces and divided into a plurality of the solid-state image pickup apparatuses 10 by dicing or the like.

The divided individual solid-state image pickup apparatus 10 already has not only the hermetic seal portion 9, but also a structure in which electrical connection is made from the pad electrodes 25 to the external terminals 29.

By using the method for manufacturing the solid-state image pickup apparatus 10 in the present embodiment described above, in the solid-state image pickup apparatus 10, the hermetic seal portion 9 is formed of the frame portion made of the inorganic insulating film 26, and the flat plate portion made of an inorganic insulating member, so that a film thickness of the inorganic insulating film 26 corresponds to a height of the frame portion. Control of the film thickness of the inorganic insulating film 26 is easy, so that according to the method for manufacturing the solid-state image pickup apparatus 10 in the present embodiment, the solid-state image pickup apparatus 10 with small fluctuations in image pickup properties between lots can be manufactured.

Also, in the method for manufacturing the solid-state image pickup apparatus 10 in the present embodiment, the inorganic insulating film 26 is made on the first major surface 20A by a CVD method, a sputtering method, or a vacuum deposition method. Then, the flat plate and the inorganic insulating film 26 are directly bonded to form the hermetic seal portion. Therefore, in the solid-state image pickup apparatus 10, a periphery of the hermetic seal portion 9 is composed of only an inorganic insulator, and a region other than the hermetic seal portion 9 is protected by the inorganic insulating film 26, so that moisture resistance and durability properties, that is, reliability, can be sufficiently ensured.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A solid-state image pickup apparatus comprising:
    a solid-state image pickup device chip including:
        a first major surface on which a light receiving portion is formed; and
        a second major surface opposed to the first major surface;
    a frame portion disposed on the first major surface of the solid-state image pickup device chip;
    a flat plate portion that covers a perforated portion of the frame portion, wherein
    the frame portion is made of an inorganic insulating film,
    the flat plate portion is made of a transparent inorganic insulating member, and
    the frame portion and the flat plate portion form a hermetic seal portion configured to seal the light receiving portion.

2. The solid-state image pickup apparatus according to claim 1, wherein the inorganic insulating film is made of any of silicon oxide, silicon nitride, silicon oxynitride, yttria, alumina, Sialon, amorphous silicon, and amorphous silicon carbide.

3. The solid-state image pickup apparatus according to claim 1, wherein the inorganic insulating film is a film made on the first major surface by one of a CVD method, a sputtering method, and a vacuum deposition method.

4. The solid-state image pickup apparatus according to claim 1, further comprising a through wiring formed from under a pad electrode on the first major surface to the second major surface, wherein an external terminal on the second major surface is electrically connected to the pad electrode via the through wiring.

5. The solid-state image pickup apparatus according to claim 1,
    further comprising a through wiring formed from under a pad electrode on the first major surface to the second major surface, wherein an external terminal on the second major surface is electrically connected to the pad electrode via the through wiring,
    wherein the inorganic insulating film is a film made of any of silicon oxide, silicon nitride, silicon oxynitride, yttria, alumina, Sialon, amorphous silicon, and amorphous silicon carbide, made on the first major surface by one of a CVD method, a sputtering method, and a vacuum deposition method.

6. The solid-state image pickup apparatus according to claim 1, wherein the inorganic insulating film covers a pad electrode on the first major surface.

7. The solid-state image pickup apparatus according to claim 1, wherein the frame portion covers a region other than the perforated portion of the first major surface.

8. The solid-state image pickup apparatus according to claim 7, wherein the frame portion is formed by removing a part of the inorganic insulating film formed on an entire surface of the first major surface, the part being located on an upper region of the light receiving portion, to form the perforated portion.

* * * * *